United States Patent
Cima

(10) Patent No.: US 11,650,228 B1
(45) Date of Patent: May 16, 2023

(54) VERY-WIDE-BANDWIDTH CURRENT SENSOR

(71) Applicant: SAFRAN ELECTRICAL & POWER, Blagnac (FR)

(72) Inventor: Lionel Cima, Moissy-Cramayel (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 0 days.

(21) Appl. No.: 17/995,130

(22) PCT Filed: Mar. 24, 2021

(86) PCT No.: PCT/FR2021/050504
§ 371 (c)(1),
(2) Date: Sep. 30, 2022

(87) PCT Pub. No.: WO2021/198589
PCT Pub. Date: Oct. 7, 2021

(30) Foreign Application Priority Data

Apr. 2, 2020 (FR) .................................. FR2003328

(51) Int. Cl.
*G01R 15/18* (2006.01)
*G01R 19/10* (2006.01)

(52) U.S. Cl.
CPC ........... *G01R 15/181* (2013.01); *G01R 19/10* (2013.01)

(58) Field of Classification Search
CPC ............................ G01R 15/181; G01R 19/10
See application file for complete search history.

(56) References Cited

U.S. PATENT DOCUMENTS

| 6,313,623 B1 | 11/2001 | Kojovic et al. |
| 6,366,076 B1 | 4/2002 | Karrer et al. |

(Continued)

FOREIGN PATENT DOCUMENTS

| CN | 107390081 A | 11/2017 |
| EP | 1596205 A1 | 11/2005 |

(Continued)

OTHER PUBLICATIONS

International Search Report issued in International Application No. PCT/FR2021/050504 dated Oct. 14, 2021.

(Continued)

*Primary Examiner* — Paresh Patel
(74) *Attorney, Agent, or Firm* — Bookoff McAndrews, PLLC

(57) ABSTRACT

Electrical circuit for measuring a current flowing in a conductor comprising:
a first pair of Rogowski-type coils connected in series, the Rogowski-type coils of the first pair being able to operate in a first frequency band;
a second pair of Rogowski-type coils connected in series, the Rogowski-type coils of the second pair being able to operate in a second frequency band, the second frequency band comprising at least partly frequencies higher than the frequencies of the first frequency band; and
a means for electrically shielding the first pair of coils, and wherein a core of the Rogowski-type coils of the first and second pairs has a relative permeability of less than 10 and wherein one coil of each pair comprises at least one multi-turn winding, the other coil of the pair comprising at least one multi-turn winding.

9 Claims, 3 Drawing Sheets

(56) References Cited

U.S. PATENT DOCUMENTS

| | | | | |
|---|---|---|---|---|
| 2008/0106253 A1* | 5/2008 | Kojovic | ................. | H01F 5/003 |
| | | | | 336/229 |
| 2008/0303511 A1* | 12/2008 | Grno | .................... | G01R 15/181 |
| | | | | 324/117 R |
| 2014/0333290 A1 | 11/2014 | Boudreau, Jr. et al. | | |
| 2017/0059622 A1* | 3/2017 | Cook | ................... | G01R 15/181 |
| 2017/0356935 A1* | 12/2017 | Hurwitz | ................. | G01R 19/12 |

FOREIGN PATENT DOCUMENTS

| | | |
|---|---|---|
| FR | 2831704 A1 | 5/2003 |
| KR | 101317220 B1 | 10/2013 |

OTHER PUBLICATIONS

Written Opinion of the International Searching Authority (WO/ISA) dated Oct. 14, 2021.

\* cited by examiner

[Fig. 1]
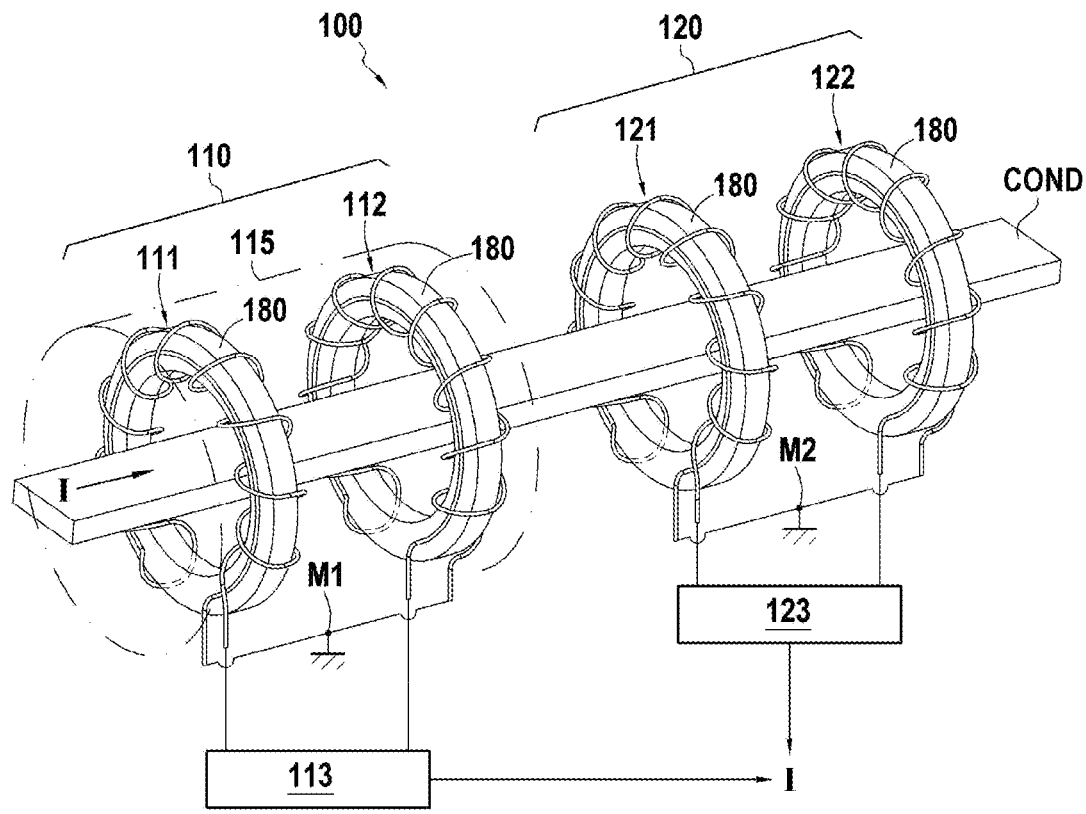
[Fig. 2A]
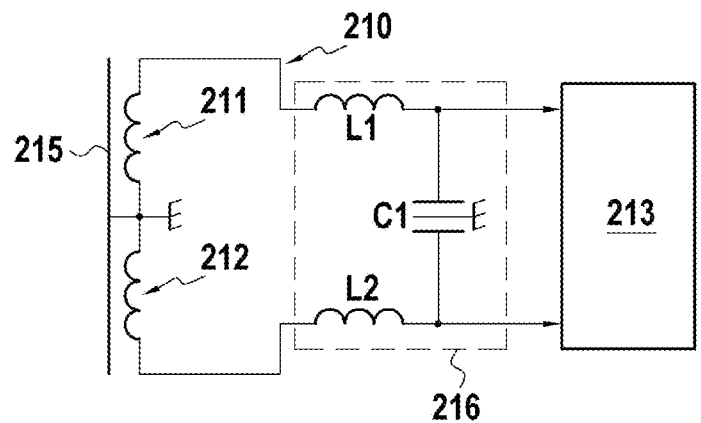

[Fig. 2B]
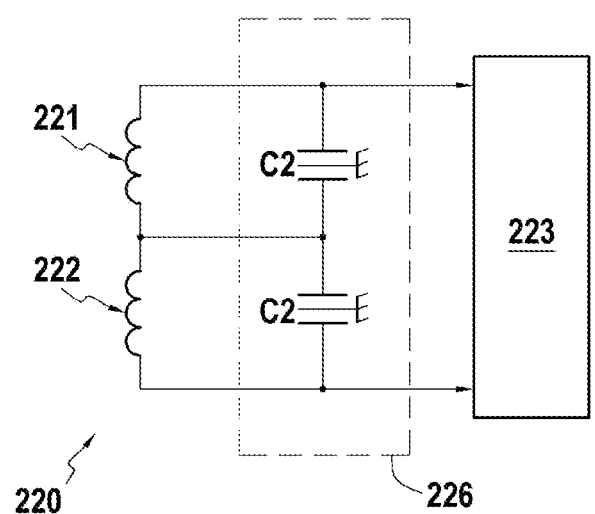

[Fig. 3]
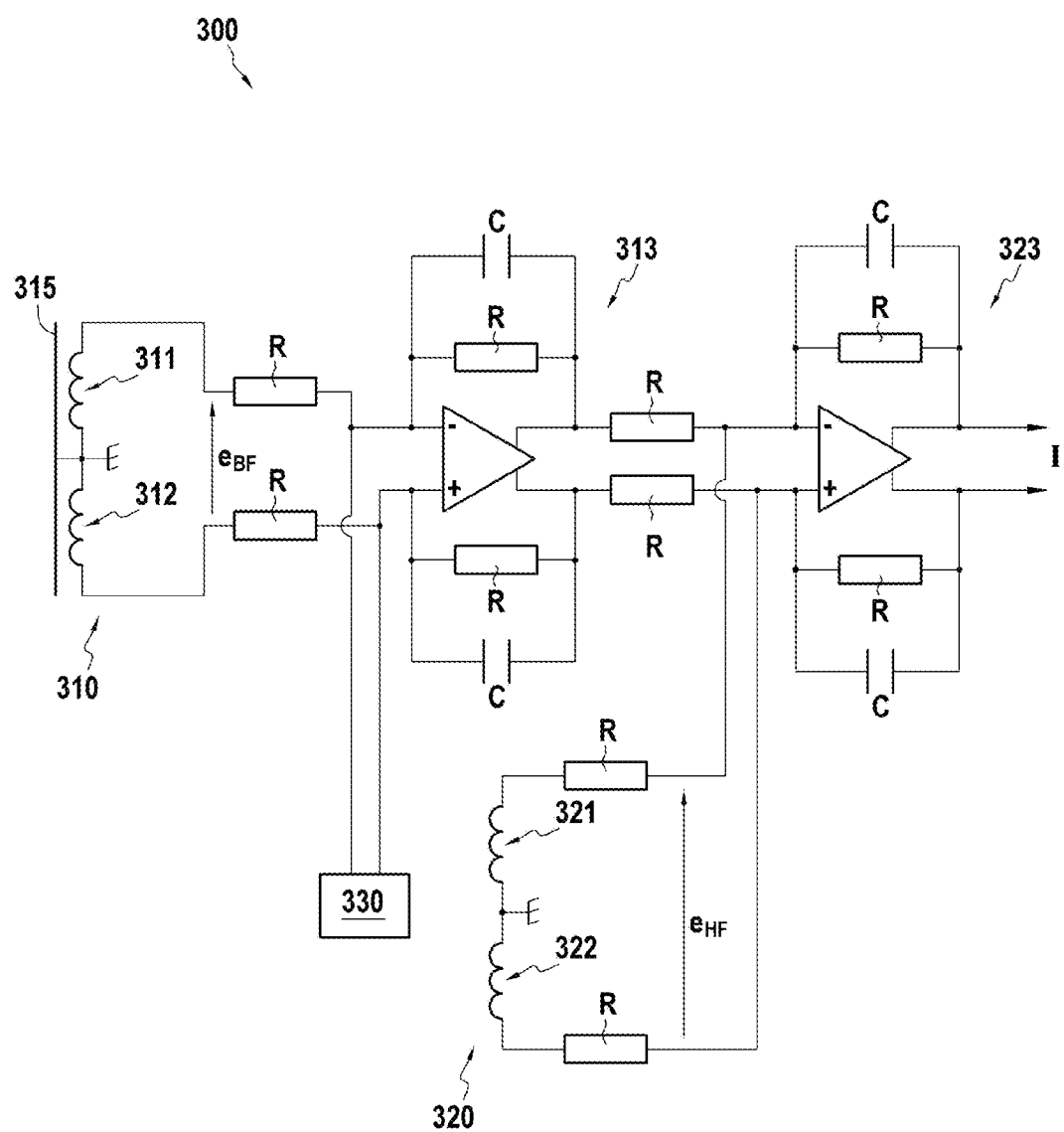

VERY-WIDE-BANDWIDTH CURRENT SENSOR

CROSS-REFERENCE TO RELATED APPLICATION(S)

This patent application is a national stage entry of International Application No. PCT/FR2021/050504, filed on Mar. 24, 2021, which claims priority to French Application No. FR2003328, filed on Apr. 2, 2020.

TECHNICAL FIELD

The invention relates to the measurement of current flowing in a conductor, and more particularly to the measurement of current by high bandwidth Rogowski-type devices.

PRIOR ART

Among the high frequency band current sensors, there are in particular current sensors of the current transformer type which allow ensuring galvanic separation between the measuring device and the measurement. For high bandwidth applications, it is necessary to have a core of high relative permeability over the entire frequency band. This makes them sensitive to direct currents which will saturate their magnetic core and thus degrade the measurement. They are also bulky and of high mass.

Another type of sensor has been developed to perform measurements of alternating currents insensitive to direct currents and usable over a wide frequency range: Rogowski-type current sensors, such as the one disclosed in particular in document U.S. Pat. No. 6,313,623. They allow determining the value of a current flowing through a conductor from a voltage generated by the current in weakly magnetic or non-magnetic air or core coils, the voltage generated being proportional to the time derivative of the current. This type of sensor is relatively compact and is insensitive to continuous components of the current due to the absence of a magnetic core in the coil. However, this type of sensor only works for limited frequency ranges, either at low frequencies, typically from 0.1 Hz to 100 kHz, or at high frequencies, typically from 100 kHz to 300 MHz.

It is therefore desirable to have a compact current measuring device for covering a frequency band ranging from low frequency to high frequency, while being immune to rapid variations in voltage, current and to temperature drifts.

DISCLOSURE OF THE INVENTION

The invention relates to an electrical circuit for measuring a current flowing in a conductor comprising:
- a first pair of Rogowski-type coils connected in series, the Rogowski-type coils of the first pair being able to operate in a first frequency band;
- a second pair of Rogowski-type coils connected in series, the Rogowski-type coils of the second pair being able to operate in a second frequency band, the second frequency band comprising at least partly frequencies higher than the frequencies of the first frequency band; and
- a means for electrically shielding the first pair of Rogowski-type coils, and in which a core of the Rogowski-type coils of the first and second pairs has a relative permeability of less than 10 and in which one coil of each pair comprises at least one multi-turn winding, the other coil of the pair comprising at least one multi-turn winding wound in the opposite direction.

By "coil" is meant a ring-shaped dipole constituted by at least one multi-turn winding delimiting an internal space of the coil. The internal space of the coil is thus the measurement space around the conductor, in which the current to be measured, delimited by the multi-turn windings of the coils, flows.

Within a pair of Rogowski-type coils, the windings are wound in opposite directions in order to constitute a differential structure for rejecting the capacitive couplings.

The shielding of the first pair allows limiting the bandwidth of the coils of the first pair and protecting them against the rapid time variations in voltage and current as well as against the parasitic resonances.

Having a pair of Rogowski-type coils for a first frequency band and a second pair for a second frequency band allows covering a high bandwidth for the current measurement while maintaining an excellent signal-to-noise ratio.

The cores of the coils of the two pairs have a relative permeability of less than 10 so as not to disturb the current measurement by continuous components of the current.

According to one particular characteristic of the invention, the first frequency band is dedicated to the low frequency, typically from 0.1 Hz to 100 kHz.

According to another particular characteristic of the invention, the second frequency band is dedicated to the high frequency, typically beyond 100 kHz.

According to another particular characteristic of the invention, the means for shielding the first pair of coils consist of a short-circuit turn surrounding the two coils of the first pair. The short-circuit turn thus allows limiting the intensity of the magnetic field in the coils of the first pair to avoid breakdown phenomena during rapid variations in intensity, to ensure an electrostatic screening function for protecting the coils in case of rapid variations in voltage and allows degrading the quality coefficient of the coiling of the second pair to reduce or even cancel the parasitic resonances at high frequency.

According to another particular characteristic of the invention, the core of the coils is non-magnetic or superparamagnetic. This allows increasing the sensitivity of the coils without introducing a non-linearity.

According to another particular characteristic of the invention, the Rogowski-type coils of the first pair comprise an even number of winding layers. A coil of the first pair comprises for example two concentric multi- turn windings, the second multi-turn winding being formed by the return wire of the Rogowski-type coil on the first multi-turn winding. Having an even number of layers of windings, instead of using the central return wire of the Rogowski-type coils, in the first pair allows increasing sensitivity. The increase in sensitivity is however accompanied by a decrease in bandwidth, which is why this is preferably used on the first pair of coils.

According to one embodiment, the circuit also comprises at least one means for filtering a common mode of the first pair placed across terminals of the first pair.

According to another embodiment, the circuit also comprises at least one means for filtering a common mode of the second pair placed across terminals of the second pair.

The filtering of a common mode of the pairs of coils allows attenuating the current at the output of the two pairs created by the time voltage drift. The filtering can be carried out by capacitors, and more particularly by X2Y®-type three-terminal capacitors. For the first pair, dedicated to the low frequencies, the filtering can also comprise inductive elements. Using X2Y®-type capacitors allows producing a measuring circuit which is more compact, less expensive and more suitable for high frequencies and capable of increasing the bandwidth.

According to another embodiment, the electrical circuit also comprises:
 a first HOKA-type filter, at least one input of which is connected to the first pair; and
 a second HOKA-type filter whose inputs are connected to the second pair and to an output of the first HOKA-type filter.

The HOKA-type filters are defined in the article by N. Karrer and P. Hoffer-Noser, "A new current measuring principle for power electronic applications", 1999 and they allow combining the different signals arriving at the input of these filters. Thus, the second HOKA-type filter combines the signals coming from the second pair and the signals at the output of the first HOKA-type filter. The first HOKA-type filter can combine the signals coming from the first pair with other signals provided at the input of the first filter. If the first HOKA-type filter only receives as input the signals coming from the first pair, then it will act as a first-order low-pass filter.

The two HOKA-type filters placed at the output of the first and second pairs of coils allow integrating the signal recovered at the output of the coils in order to be able to determine the current value flowing in the conductor. Indeed, the signal recovered at the output of the two pairs of Rogowski-type coils is a voltage generated by the flowing of current in the conductor, this voltage being proportional to the time derivative of the current flowing in the conductor. In addition, thanks to the use of two pairs of Rogowski-type coils each dedicated to a frequency band, it is possible to determine the value of the current in the conductor thanks to the measuring circuit according to the invention over a high bandwidth and with a very low noise level.

The two HOKA-type filters can be analog filters or digital filters.

The measuring circuit according to the invention thus allows carrying out a differential output measurement of the current flowing in the conductor.

The differential output allows improving the immunity of the sensor in a severe electromagnetic environment.

According to one particular characteristic of the invention, the circuit also comprises a direct current sensor whose output is placed at the input of the first HOKA-type filter. Thus, the first HOKA-type filter will combine the signals derived from the first pair and the signals derived from the direct current sensor.

The addition of a direct current sensor allows increasing the bandwidth of the current sensor and thus also measuring direct currents.

According to another particular characteristic of the invention, the direct current sensor is a Néel® effect sensor.

According to another particular characteristic of the invention, the first and second pairs are present on at least one printed circuit.

According to another particular characteristic of the invention, the first and second pairs are present on at least one flexible support.

Another object of the invention is a current sensor comprising an electrical circuit according to the invention.

A current sensor comprising an electrical circuit according to the invention allows obtaining a current sensor having a very low noise level, on the order of 0.01% of full scale, capable of following current variation speeds ranging from 1 A/s to 10 kA/s with a bandwidth covering the range from 1 Hz to more than 10 MHz.

Another object of the invention is a method for measuring a current flowing in a conductor implemented by the current sensor of the invention comprising at least one step of winding the Rogowski-type coils of the first and second pairs around said conductor.

The method according to the invention allows determining currents flowing in a conductor thanks to the use of a current sensor according to the invention.

BRIEF DESCRIPTION OF THE DRAWINGS

Other characteristics and advantages of the present invention will emerge from the description given below, with reference to the appended drawings which illustrate exemplary embodiments without any limitation.

FIG. 1 schematically and partially represents an electrical circuit for measuring a current according to one embodiment of the invention.

FIG. 2A schematically and partially represents part of the electrical measuring circuit comprising a filtering of a common mode of the first pair of Rogowski-type coils according to another embodiment of the invention.

FIG. 2B schematically and partially represents part of the electrical measuring circuit comprising a filtering of a common mode of the second pair of Rogowski-type coils according to another embodiment of the invention.

FIG. 3 represents an electrical measuring circuit which can perform differential current measurements and comprising a direct current sensor according to another embodiment of the invention.

DESCRIPTION OF THE EMBODIMENTS

In its simplest form, a Rogowski-type coil is a coil having an air core. Nevertheless, "Rogowski coil" currently refers to coils having a non-magnetic core or having a weakly magnetic core. Throughout the description, "Rogowski-type coil" will refer to a coil having a core of relative permeability of less than 10 over the entire bandwidth covered by the measuring circuit of the invention.

As indicated above, by "coil" is meant a ring-shaped dipole consisting of at least one multi-turn winding delimiting an internal space of the coil as well as the measurement space around the conductor.

FIG. 1 schematically and partially represents an electrical circuit 100 for measuring a current I in a conductor COND according to one embodiment of the invention. This circuit 100 comprises a first pair 110 of Rogowski-type coils 111 and 112. The coils of the first pair 110 each comprise at least one multi-turn winding. The winding of the coil 111 is wound in a first direction and the winding of the other coil 112 is wound in a second direction that is to say in the opposite direction.

Winding the windings of the coils of the same pair in opposite directions will allow rejecting the capacitive couplings between the conductor COND and the coils 111 and 112. Indeed, this capacitive coupling will appear in common mode on the two coils 111 and 112, while the electromotive forces due to the current I will appear in differential mode. The two coils 111 and 112 must then be connected together in series, the "midpoint" M1 between the two coils being placed at a fixed potential, for example at an electrical ground. A measurement of the differential mode voltage at the output of the two coils 111 and 112 will thus allow greatly attenuating the capacitive coupling appearing in common mode.

The circuit 100 also comprises a second pair 120 of Rogowski-type coils 121 and 122. The coils 121 and 122 each comprise at least one multi-turn winding. The windings of the coils 121 and 122 are wound in the opposite direction in the same way as for the coils 111 and 112 of the first pair 110 in order to reject the capacitive couplings between the conductor COND and the coils 121 and 122. The coils 121 and 122 are connected together in series, and as for the coils 111 and 112, their "midpoint" M2 is placed at a fixed potential.

The first pair of Rogowski-type coils 110 is dedicated to a first frequency band and the second pair 120 to a second frequency band. The second frequency band comprises at least partly frequencies higher than those of the first frequency band. The first frequency band will be for example dedicated to the low frequency while the second frequency band will be dedicated to the high frequency.

The first pair 110 is surrounded by a short-circuit turn 115 which ensures electrical shielding of the first pair 110. This shielding allows limiting the bandwidth of the coils 111 and 112 of the first pair 110 and protecting them against the high current variation speeds and damping the high-frequency parasitic resonances of these same coils.

The core 180 of the coils of the two pairs 110 and 120 is a core 180 having a relative permeability of less than 10, or even less than 2, or even less than 1.1.

To measure the current I flowing in a conductor COND with the coils described previously, it is necessary to place the conductor COND in the winding of the coils 111, 112, 121 and 122. The flowing of the current I in the conductor COND will generate a voltage at the output of the two pairs 110 and 120 which is proportional to the derivative of the current I. Thus, to determine the value of the current I, the voltage recovered at the output of the two pairs 110 and 120 is integrated.

For that, the circuit comprises two HOKA-type filters 113 and 123, placed at the output of the two pairs. One of the HOKA-type filters 113 is therefore placed at the output of the first pair 110 and the other 123 at the output of the second pair 120. These HOKA-type filters 113 and 123 consist of a first-order low-pass filter and an adder. The adder allows combining the signals delivered by the assembly consisting of the first pair and the low-pass filter, thus forming a current sensor able to measure a current at low frequency and the signals delivered by the second pair which forms a current variation speed sensor dI/dt able to measure a current variation speed at high frequency.

The low-pass filter acts as a simple low-pass filter for the low-frequency current sensor, while it acts as an integrator for the high-frequency current variation sensor. Thus, the second HOKA-type filter allows combining the signals delivered by a low-frequency current sensor and a high-frequency current variation sensor to constitute a higher bandwidth current sensor.

Thanks to these two HOKA-type filters, it is then possible to determine the value of the current both in the first frequency band of the first pair 110 and in the second frequency band of the second pair 120.

According to one particular characteristic of the invention, for each of the Rogowski coils 111, 112, 121 and 122, the return wire is coiled so as to form a multi-turn winding. Thus, it is possible to obtain coils comprising two multi-turn windings. Or, it is also possible that within the same pair, the first coil is formed by the first multi-turn winding and that the second coil is formed by the return wire coiled into a multi-turn winding of the first coil.

According to another particular characteristic of the invention, the coils 111 and 112 of the first pair 110 comprise several layers of windings, and more particularly, they comprise an even number of layers of concentric windings superimposed on each other. By increasing the number of layers of the first pair 110, the sensitivity of the coils is increased while reducing their bandwidth. This is why this will preferably be used for the coils of the first pair 110.

According to another particular characteristic of the invention, the core 180 of the coils of a pair 110 and/or 120 is non-magnetic.

According to another particular characteristic of the invention, the core 180 of the coils of a pair 110 and/or 120 is superparamagnetic.

The fact that the core 180 is superparamagnetic or non-magnetic allows influencing the sensitivity of the measuring circuit.

According to another particular characteristic of the invention, the coils of a pair 110 and/or 120 are air coils. Their core 180 is therefore formed of air.

In order to simplify the figures, the conductor COND is not represented in FIGS. 2A to 3. In FIGS. 2A to 3, the multi-turn windings of the Rogowski-type coils within the same pair are wound in the opposite direction and the core of the coils has a relative permeability of less than 10.In addition, the first pair of coils is able to operate in a first frequency band and the second pair in a second frequency band. The second frequency band comprises at least partly frequencies higher than the frequencies of the first frequency band.

FIG. 2A schematically and partially represents part of the electrical measuring circuit comprising a filtering of a common mode of the first pair of Rogowski-type coils according to another embodiment of the invention.

As described previously, the two Rogowski-type coils 211 and 212 of the first pair 210 are connected together in series and are surrounded by a magnetic and electrical shielding means 215, for example a short-circuit turn 215. A means for filtering the common mode 216 of the first pair 210 is placed across the terminals of said pair 210 in order to filter the common mode of the coils 211 and 212. The first HOKA-type filter 213 connected to the first pair of coils 211 and 212 is placed after the filtering means 216.

The common mode filtering means 216 allows reducing the disturbance currents derived from the common mode of the first pair 210.

The filtering means 216 comprises inductive elements L1 and L2 as well as a capacitive component C1.

According to one particular characteristic of the invention, the capacitive element C1 is a three-terminal capacitor, for example a X2Y®-type capacitor. This type of ceramic capacitor is more compact than the less expensive traditional capacitors and can handle higher frequencies.

FIG. 2B schematically and partially represents part of the electrical measuring circuit comprising a filtering of a common mode of the second pair of Rogowski-type coils according to another embodiment of the invention.

As previously described in FIG. 1, the two Rogowski-type coils 221 and 222 of the second pair 220 are connected together in series.

A means for filtering the common mode 226 of the second pair 220 is placed across the terminals of said pair 220 in order to filter the common mode. The second HOKA-type filter 223 connected to the second pair of coils 221 and 222 is placed after the filtering means 226.

The filtering means 226 allows reducing the disturbance currents derived from the common mode of the second pair 220. It comprises capacitive elements C2 which are, for example, X2Y® ceramic capacitors. This type of capacitor is more compact, less expensive and handles higher frequencies than traditional capacitors.

FIG. 3 represents an electrical measuring circuit 300 according to another embodiment of the invention.

The measuring circuit 300 comprises a first pair 310 of Rogowski-type coils 311 and 312 dedicated to the low frequencies and a second pair 320 of Rogowski-type coils 321 and 322 dedicated to the high frequencies. Within the same pair, the coils are connected together in series and have windings in the opposite direction.

The first pair 310 is surrounded by a short-circuit turn 315 to limit the bandwidth of the coils 311 and 312 while protecting them from parasitic resonances due to a rise in frequency and strong current drifts.

A means for filtering the common mode of the first pair 310, as described with reference to FIG. 2A can be placed across the terminals of the first pair 310 just as a means for filtering the common mode of the second pair 320, as described with reference to FIG. 2B can be placed across the terminals of the second pair 320.

The voltage $e_{BF}$ generated in the coils 311 and 312 of the first pair 310 by the flow of the current I in the conductor is provided at the output of the first pair to the first HOKA-type filter 313.

The voltage $e_{HF}$ generated in the coils 321 and 322 by the flow of the current I in the conductor is provided at the output of the second pair to the second HOKA-type filter 323.

The two HOKA-type filters 313 and 323 allow combining and integrating the voltages $e_{HF}$ and $e_{BF}$ generated in the two pairs 310 and 320 of coils to determine the value of the current I flowing in the conductor, whether at low frequency or at high frequency.

The measuring circuit 300 can also comprise a direct current sensor 330 to determine the direct currents or the very low-frequency currents flowing in the conductor. In this case, the first HOKA-type filter 313 combines the signals of the first pair 310 and of the sensor 330, and the second HOKA- type filter 323 combines the signals at the output of the first HOKA-type filter 313 and of the second pair 320. The measuring circuit 300 thus allows obtaining a very high bandwidth current sensor.

According to one particular characteristic of the invention, the direct current sensor 330 is a Néel® effect sensor which allows accurate measurement of the direct currents or very low-frequency currents.

According to another particular characteristic of the invention, the Rogowski-type coils of the two pairs are present on at least one printed circuit.

According to another particular characteristic of the invention, the Rogowski-type coils of the two pairs are present on at least one flexible support.

The invention also relates to a current sensor comprising an electrical measuring circuit as described with reference to FIGS. 1 to 3.

The sensor according to the invention can allow performing spot measurements of a current flowing in conductors. It can also be integrated into a more complex device requiring regular or continuous measurements of a current in the same conductor.

The invention also relates to a method for measuring a current flowing in a conductor. The method is implemented by the measuring sensor according to the invention or by any of the measuring circuits according to the invention. The conductor is placed between the Rogowski-type coils of the two pairs, such that the coils are wound around this conductor. The flow of current in the conductor generates voltages in each pair of coils which are then combined and integrated to be able to determine the value of the current flowing in the conductor whatever the frequency of the current.

More generally, it is possible to measure, thanks to the sensor according to the invention, the current flowing in a conductive part or in an electrical component or in an electrical circuit external to the sensor and/or which cannot be placed in the winding of the coils. It suffices, indeed, to wind the coils of the sensor around a conductor and to connect this conductor to the part, to the component or to the circuit, such that the current flowing in this part, this component or this circuit also flows in the conductor placed in the winding of the coils.

The invention claimed is:

1. A sensor for measuring an electric current flowing in a conductor comprising:
   a first pair of Rogowski-type coils connected in series, the Rogowski-type coils of the first pair being configured to measure the electric current in a first frequency band;
   a second pair of Rogowski-type coils connected in series, the Rogowski-type coils of the second pair being configured to measure the electric current in a second frequency band, the second frequency band comprising at least partly frequencies higher than the frequencies of the first frequency band; and
   a means for electrically shielding the first pair of coils, and wherein a core of the Rogowski-type coils of the first and second pairs has a relative permeability of less than 10 and wherein one coil of each pair comprises at least one multi-turn winding, the other coil of the pair comprising at least one multi-turn winding wound in the opposite direction.

2. The sensor according to claim 1 wherein the Rogowski-type coils of the first pair comprise an even number of multi-turn winding layers.

3. The sensor according to claim 1 also comprising at least one means for filtering a common mode of the first pair placed across terminals of the first pair.

4. The sensor according to claim 1 also comprising at least one means for filtering a common mode of the second pair placed across terminals of the second pair.

5. The sensor according to claim 1 also comprising:
   a first HOKA-type filter, at least one input of which is connected to the first pair; and
   a second HOKA-type filter whose inputs are connected to the second pair and to an output of the first HOKA-type filter.

6. The sensor according to claim 5 also comprising a direct current sensor whose output is placed at the input of the first HOKA-type filter, the direct current sensor being able to measure a direct current in said conductor.

7. The sensor according to claim 1 wherein the first and second pairs are present on at least one printed circuit.

8. The sensor according to claim 1 wherein the first and second pairs are present on at least one flexible support.

9. A method for measuring a high bandwidth electric current flowing in a conductor implemented by the electric current sensor according to claim 1, comprising:
   a winding of the Rogowski-type coils of the first and second pairs around said conductor;
   a first current measurement in a first frequency band;

a second current measurement in a second frequency band, the second frequency band comprising at least partly frequencies higher than the frequencies of the first frequency band; and a combination of the two current measurements in order to determine a current measurement on a frequency band comprising the first frequency band and the second frequency band.

* * * * *